(12) United States Patent
Bandell

(10) Patent No.: US 9,337,812 B2
(45) Date of Patent: May 10, 2016

(54) AVALANCHE PULSER

(75) Inventor: Howard M. Bandell, Leesburg, VA (US)

(73) Assignee: NIITEK, INC., Dulles, VA (US)

( * ) Notice: Subject to any disclaimer, the term of this patent is extended or adjusted under 35 U.S.C. 154(b) by 740 days.

(21) Appl. No.: 13/586,327

(22) Filed: Aug. 15, 2012

(65) Prior Publication Data

US 2013/0214966 A1     Aug. 22, 2013

Related U.S. Application Data

(60) Provisional application No. 61/523,512, filed on Aug. 15, 2011.

(51) Int. Cl.
| | |
|---|---|
| *H03K 3/335* | (2006.01) |
| *G01S 7/03* | (2006.01) |
| *G01S 7/282* | (2006.01) |
| *G01S 13/88* | (2006.01) |
| *G01S 13/14* | (2006.01) |

(52) U.S. Cl.
CPC ............... *H03K 3/335* (2013.01); *G01S 7/032* (2013.01); *G01S 7/282* (2013.01); *G01S 13/14* (2013.01); *G01S 13/885* (2013.01)

(58) Field of Classification Search
CPC ...................................................... H03K 3/335
See application file for complete search history.

(56) References Cited

U.S. PATENT DOCUMENTS

| | | | | |
|---|---|---|---|---|
| 3,017,519 A | * | 1/1962 | Dill ................................ | 327/580 |
| 3,126,489 A | * | 3/1964 | Dill ................................ | 327/172 |
| 3,223,854 A | * | 12/1965 | Hansen et al. ................. | 327/580 |
| 3,263,098 A | * | 7/1966 | James et al. ................... | 327/173 |
| 3,286,180 A | * | 11/1966 | Hubbs ........................ | 324/762.08 |
| 3,405,287 A | * | 10/1968 | Miller ........................... | 327/291 |
| 3,940,696 A | | 2/1976 | Nagy | |
| 4,492,879 A | * | 1/1985 | Tsuchiya et al. .............. | 327/134 |
| 5,003,191 A | * | 3/1991 | Boyle et al. .................... | 307/109 |
| 5,216,695 A | * | 6/1993 | Ross et al. ..................... | 375/295 |
| 5,307,079 A | * | 4/1994 | Ross et al. ..................... | 343/822 |
| 5,889,583 A | | 3/1999 | Dunne | |
| 6,597,309 B1 | * | 7/2003 | Panton et al. ................. | 342/134 |
| 8,207,885 B2 | * | 6/2012 | Hibbard et al. ................ | 342/22 |

FOREIGN PATENT DOCUMENTS

WO     WO 2009/038898 A1     3/2009

OTHER PUBLICATIONS

International Search Report and Written Opinion of the International Searching Authority for corresponding International Application No. PCT/US2012/050892 with mailing date Feb. 5, 2013 (10 pages total).

* cited by examiner

*Primary Examiner* — Matthew M Barker
(74) *Attorney, Agent, or Firm* — Finnegan, Henderson, Farabow, Garrett & Dunner, L.L.P.

(57) ABSTRACT

Circuits and methods for generating a pulse are provided. The generating can comprise receiving at least one trigger input signal with a pulse generating circuit; generating a voltage pulse having a duration less than the avalanche time of a transistor in response to at least a portion of the at least one trigger input signal with the pulse generating circuit; transmitting the voltage pulse from the pulse generating circuit to a terminal of the transistor, the transistor constructed and arranged to be operable in an avalanche mode; and outputting an avalanche pulse from at least one terminal of the transistor in response to the voltage pulse. In some embodiments, the pulse can be transmitted with an antenna in a radar system, and a return pulse can be received and processed.

62 Claims, 4 Drawing Sheets

AVALANCHE PULSER

PRIORITY

This application claims the benefit of priority from U.S. Provisional Application No. 61/523,512, filed Aug. 15, 2011, which is herein incorporated by reference in its entirety.

FIELD

This disclosure relates to systems and methods for generating a pulse. Consistent with this disclosure, the generated pulses can be used in radar applications.

SUMMARY

In one aspect, the present disclosure is directed to a circuit for generating a pulse. The circuit can include a transistor and a pulse generating circuit. The transistor can be constructed and arranged to be operable in an avalanche mode. The pulse generating circuit can be constructed and arranged to: receive at least one trigger input signal; generate a voltage pulse having a duration less than an avalanche time of the transistor in response to at least a portion of the at least one trigger input signal; and transmit the voltage pulse to a terminal of the transistor. Consistent with the aspect, the transistor can be constructed and arranged to output an avalanche pulse from at least one terminal of the transistor in response to the voltage pulse.

In another aspect, the present disclosure is directed to a method for generating a pulse. The method can include receiving at least one trigger input signal with a pulse generating circuit and generating, with the pulse generating circuit, a voltage pulse in response to at least a portion of the at least one trigger input signal. The method can also include transmitting the voltage pulse from the pulse generating circuit to a terminal of a transistor constructed and arranged to be operable in an avalanche mode, and outputting an avalanche pulse from at least one terminal of the transistor in response to the voltage pulse. Consistent with the aspect, the voltage pulse can have a duration less than an avalanche time of the transistor.

In a further aspect, the present disclosure is directed to a radar system. The radar system can include a circuit including a transistor and a pulse generating circuit. The transistor can be constructed and arranged to be operable in an avalanche mode. The pulse generating circuit can be constructed and arranged to: receive at least one trigger input signal; generate a voltage pulse having a duration less than an avalanche time of the transistor in response to at least a portion of the at least one trigger input signal; and transmit the voltage pulse to a terminal of the transistor. Consistent with the aspect, the transistor can be constructed and arranged to output an avalanche pulse from at least one terminal of the transistor in response to the voltage pulse. The radar system can further include an antenna connected to the circuit, where the antenna can be constructed and arranged to transmit the avalanche pulse and receive a return pulse. The radar system can further include a processor connected to the antenna, where the processor can be constructed and arranged to process the return pulse, generate image data, and transmit the image data to a display.

In an additional aspect, the present disclosure is directed to a method for creating a radar image. The method can include receiving: at least one trigger input signal with a pulse generating circuit; generating, with the pulse generating circuit, a voltage pulse in response to at least a portion of the at least one trigger input signal; and transmitting the voltage pulse from the pulse generating circuit to a terminal of a transistor constructed and arranged to be operable in an avalanche mode. The method can also include outputting an avalanche pulse from at least one terminal of the transistor to an antenna in response to the voltage pulse, transmitting the avalanche pulse with the antenna, receiving a return pulse with the antenna, processing the return pulse with a processor to generate image data, and transmitting the image data to a display. Consistent with the aspect, the voltage pulse can have a duration less than an avalanche time of the transistor.

Additional features and advantages will be set forth in part in the description which follows, being apparent from the description of or learned by practice of the disclosed embodiments. The features and advantages will be realized and attained by means of the elements and combinations particularly pointed out in the appended claims.

It is to be understood that both the foregoing general description and the following detailed description are exemplary and explanatory only and are not restrictive of the scope of the embodiments, as claimed.

DESCRIPTION OF THE EMBODIMENTS

Figure 1:
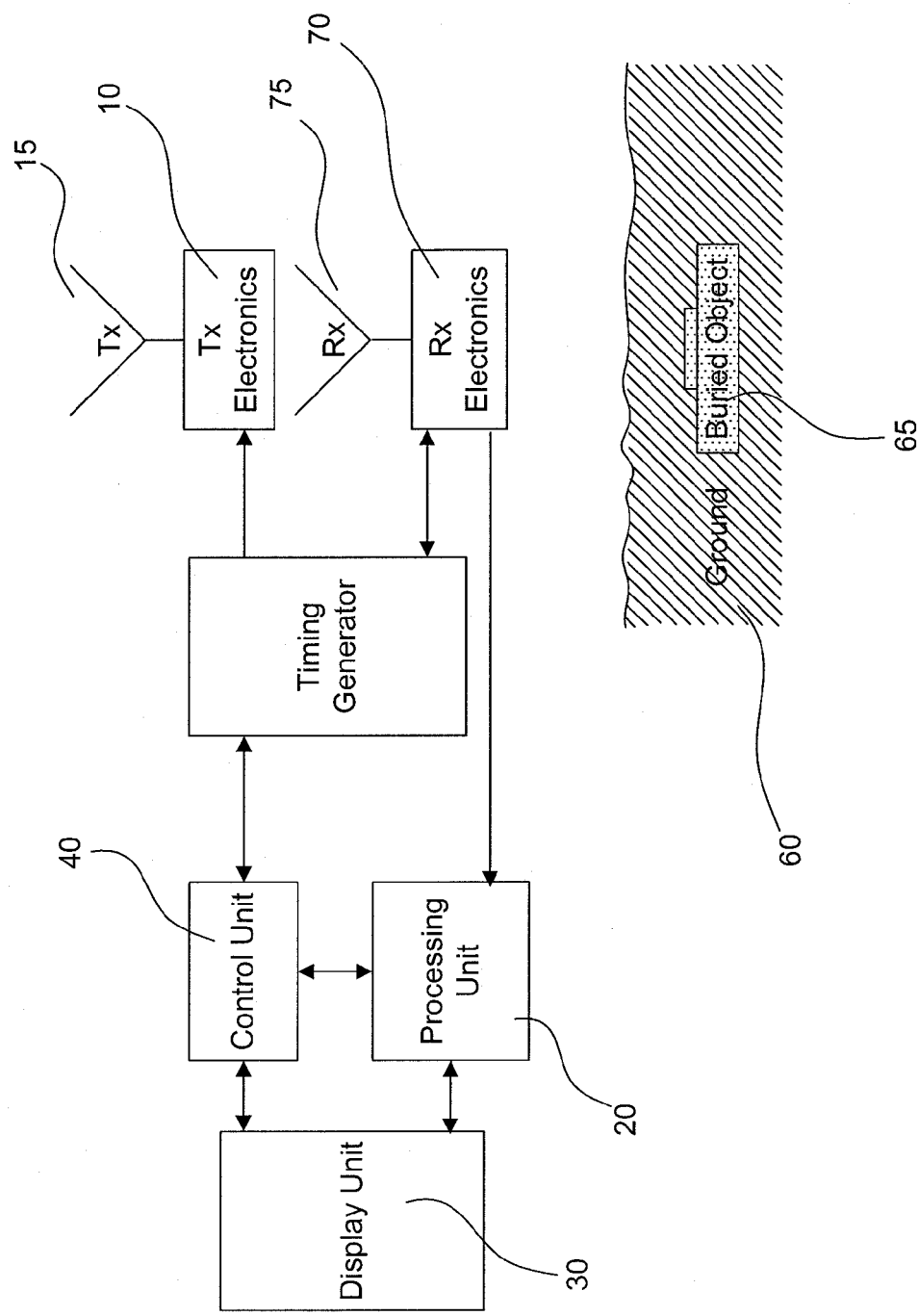
FIG. 1 depicts a ground penetrating radar system according to an embodiment consistent with the disclosure.

Circuits capable of generating narrow pulses of high energy can be useful in certain applications. For example, radar systems, such as ground penetrating radar (GPR) systems, can be configured to transmit high energy pulses consistent with this disclosure. By way of example only, a GPR system consistent with this disclosure can be configured to transmit narrow pulses of high energy into the ground to detect buried objects. An embodiment of a GPR system consistent with this disclosure is depicted in FIG. 1. The GPR system can include transmitter unit 10, a receiver unit 70, a processing unit 20, a display unit 30, a control unit 40, and/or other components. A transmitter/receiver unit consistent with this disclosure can include one or more elements 15 and 75 (e.g. antennas) that transmit radar signals and receive returned signals. Transmitter and receiver elements 15 and 75 can be separate (as depicted) or can be integrated into a single element (i.e., a transceiver element). Embodiments of circuits consistent with this disclosure (which can form a part of transmitter unit 10 in FIG. 1, and described further below) can be used to generate transmit pulses which can be delivered to the transmitter element(s) 15. The transmitter element(s) 15 can radiate the pulses. These radiated pulses can travel into the ground 60, and a buried object 65 can reflect the radiated pulses. Reflected radiation received by the receiver element(s) 75 can enable the GPR system to provide data about buried objects to a user. The processing unit 20 can process the received radiation to form image data and transmit the image data to the display unit 30 which can allow a user to view the buried object data. The control unit 40 can be provided to control the operation of: a pulse generating circuit consistent with this disclosure (for example by providing or controlling an input signal), the processing unit 20, and/or the display unit 30. In some embodiments consistent with this disclosure, control and processing operations can be performed by one or more processors and/or by one or more circuits. In some embodiments, control and processing functions can be performed by the same one or more processors and/or circuits.

Avalanche transistors can be used to generate the pulses used by GPR systems consistent with this disclosure, and in other applications. Avalanche pulses can themselves be triggered by trigger pulses. For example, the rising edge of a trigger pulse can cause the avalanche pulse in some transistors. If the trigger pulse remains high for a time longer than a length of the avalanche pulse, the avalanche transistor can enter an "on" state and emit noise. A brief trigger pulse with a fast rising and falling edge can trigger an avalanche pulse with little or no noise. The following discussion describes various embodiments of circuits and methods which can provide these brief trigger pulses consistent with this disclosure.

Figure 2:
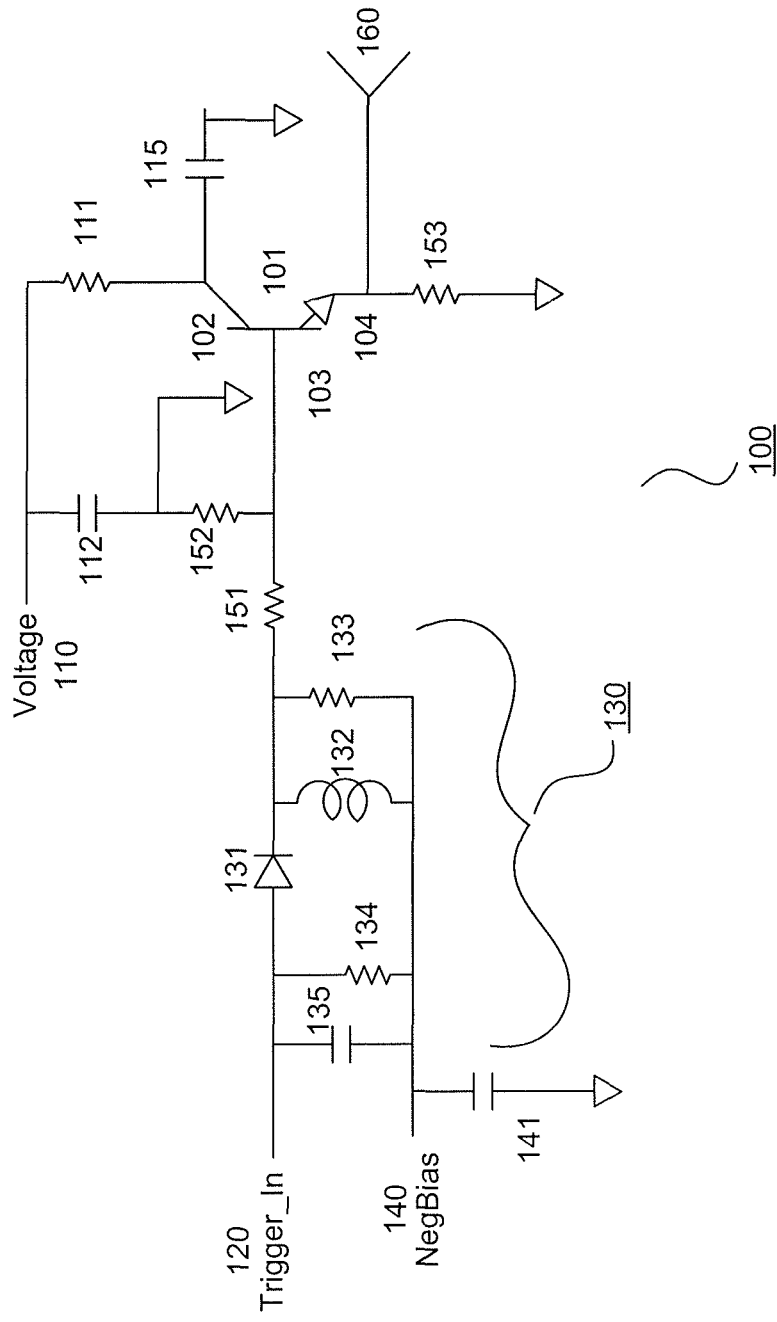
FIG. 2 depicts a circuit for generating a pulse according to an embodiment consistent with the disclosure.

FIG. 2 depicts an avalanche pulser circuit 100 according to an embodiment consistent with this disclosure. Embodiments of the avalanche pulser circuit 100 can include a transistor 101 which can operate in avalanche mode. The transistor 101 can be an NPN transistor or any other transistor capable of operating in avalanche mode. When the collector 102 of the transistor 101 conducts, current can flow from a high voltage source 110 through the transistor 101. The high voltage from the high voltage source 110 can be stored on a capacitor or capacitors 115, or the high voltage can flow from the high voltage source 110 through a resistor 111. The capacitor 115 can be present between the collector 102 and ground to facilitate avalanche operation in the transistor 101. A capacitor or capacitors 112 can be present between the high voltage source 110 and ground and can filter noise in the high voltage source 110. The high voltage source 110 can be set to a voltage that can allow triggerable avalanche in the transistor 101. In some embodiments an output 160 such as a 50 ohm output 160, can be taken at the emitter 104. A resistance, such as the 50 ohm resistor 153 shown in this example, can also be provided between the emitter 104 and ground to create the 50 ohm output.

The avalanche pulser circuit 100 can comprise a pulse generating circuit 130 which can feed a triggering signal to a base 103 of the transistor 101. A trigger input 120 can be fed into the pulse generating circuit 130. The pulse generating circuit 130 can comprise a step recovery diode 131 (SRD) and inductor 132. In some embodiments consistent with this disclosure, the pulse generating circuit 130 can also comprise a damping resistor 133 at the SRD 131 cathode and a capacitor 135 and resistor 134 at the SRD 131 anode. The SRD 131 and inductor 132 can be referenced to a negative voltage by a negative bias 140. A capacitor or capacitors 141 can be present between the negative bias 140 and ground and can stabilize the negative bias 140. Resistors 151, 152 can form a voltage divider at the base 103 in some embodiments. The impedance at the input to the base 103 can be made low (for example, 51.1 ohms) in some embodiments.

Figure 3:
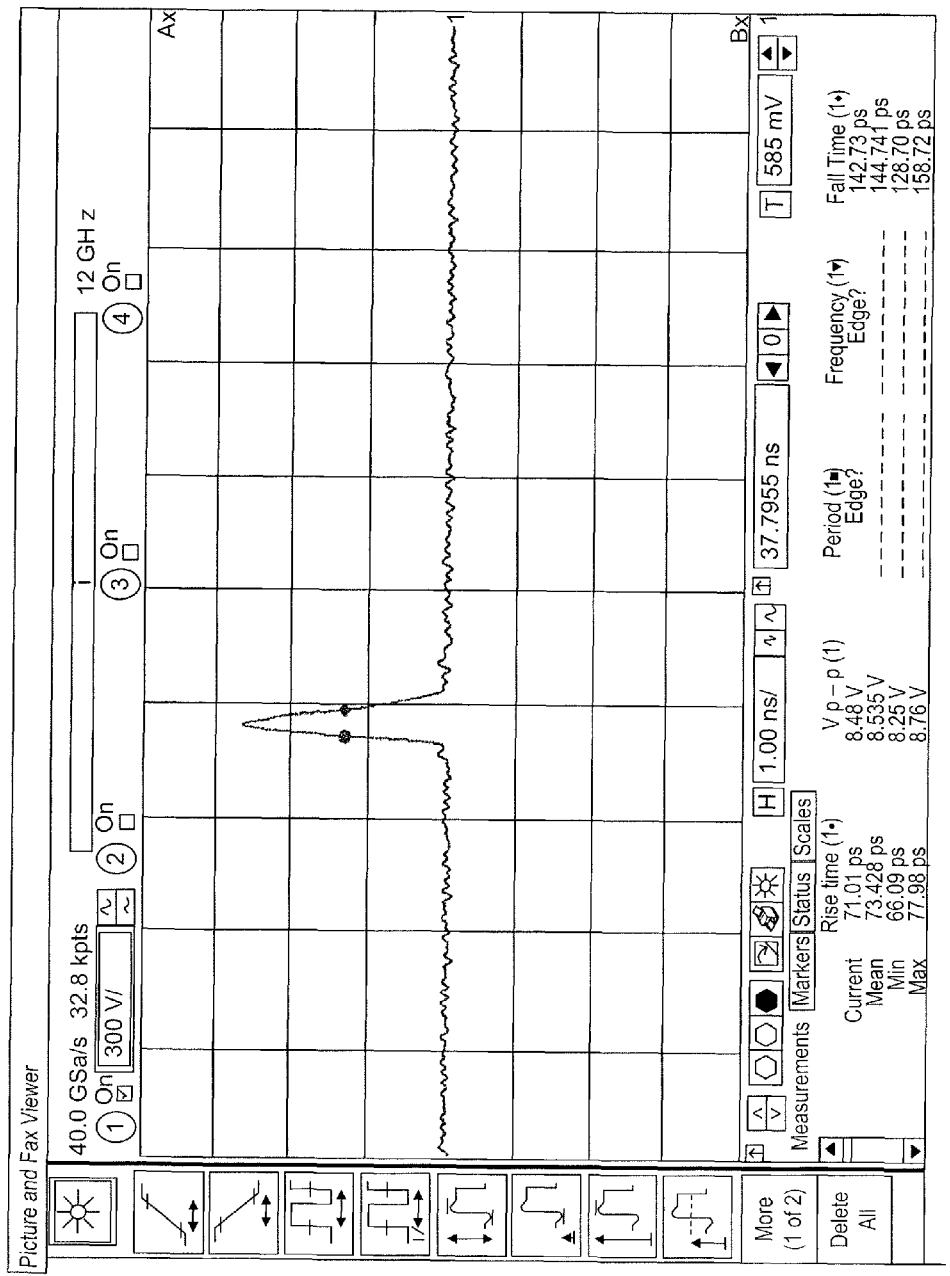
FIG. 3 depicts an output signal from a circuit for generating a pulse according to an embodiment consistent with the disclosure.

The avalanche pulser circuit 100 can trigger avalanche in the transistor 101 with a pulse and bias the transistor 101 off before an avalanche-transmitted pulse is over. In response, the transistor 101 can output a short pulse with fast rising and falling edges. For example, FIG. 3 depicts a pulse which can be obtained in single-ended mode at the emitter 104 of the transistor 101. This example is a 15 V pulse. Such a pulse can have a rise time in the 85-150 picosecond range and a fall time in the 85-200 picosecond range. These rise and fall times can depend in part on the transistor 101 used. Some embodiments of the avalanche pulser circuit 100 can produce a pulse having a total width in the 250-350 picosecond range, for example. In some embodiments consistent with this disclosure, the output of the transistor 101 can be taken in differential output mode at the collector 102 and emitter 104. In these embodiments, a 50 ohm resistor can be added in series with the collector capacitor 115. In embodiments where the output is taken differentially, a collector 102 charge and discharge can be superimposed onto the differential output, but the transistor 101 can still be quickly biased off.

Consistent with this disclosure, a pulse generating circuit can be designed to provide a very short excitation pulse to the transistor 101. Returning to FIG. 2, the trigger input 120 can be used to drive the pulse generating circuit 130 to produce a triggering signal at the base 103. In embodiments consistent with the disclosure, the trigger input 120 can be a clock signal such as a square wave with a 50% duty cycle. Other embodiments can use other trigger inputs 120 having different waveforms and/or duty cycles. In some embodiments consistent with the disclosure, the trigger input 120 can oscillate between a positive maximum voltage and a negative minimum voltage.

The pulse generating circuit 130 can receive the trigger input 120 and output a pulse trigger to the base 103. The negative voltage of the negative bias 140 can be selected so that when the trigger input 120 is at its maximum positive value, the SRD 131 can be conducting and the base 103 can be held to a negative voltage by the negative bias 140. During this period, the cathode of the SRD 131 can be at a negative voltage, and therefore the SRD 131 can be conducting in the anode to cathode direction and storing charge. The SRD 131 can behave according to the following equations. For a constant forward charging current $I_F$, the charge stored in the SRD 131 can be $Q_F = I_F T [1-e^{-(t/T)}]$, where T=the minority carrier lifetime (8 nanoseconds) and t=the time from which forward current is applied. For t/T>3, $Q_F = I_F T$. When the trigger goes negative, the SRD 131 can remain at a low impedance until the stored charge is depleted. Therefore, as long as t>24 nanoseconds, the avalanche pulser circuit 100 can be independent of duty cycle. The base 103 can also be referenced below ground by the negative bias 140 during this period, which can prevent avalanche from occurring uncontrollably in the transistor 101.

The negative edge of a trigger input signal can cause the SRD 131 to drain charge. When the charge is drained, the SRD 131 can rapidly switch to an off state and cause a rapid change in current. In response, the inductor 132 can produce a pulse that can trigger an avalanche in the transistor 101. An example of this process can proceed as follows. As noted above, in embodiments the trigger input 120 can transition from a positive voltage to a negative voltage. When the trigger input 120 is negative, the SRD 131 can conduct in the cathode to anode direction until all stored charge is swept away. When this happens, the SRD 131 can very rapidly stop conducting and cause a rapid change in current. The rapid current change can trigger a voltage pulse in the inductor 132. The pulse can rise quickly due to the rapid change in current and fall quickly due to the presence of the negative bias 140. A resistor or resistors 133 can be provided to damp the inductive pulse of the inductor 132. For example, with a 6 Vpp trigger input 120, a voltage pulse of approximately 2.5 V can be triggered in the inductor 132. The voltage pulse in the inductor 132 can be large enough to overcome the negative voltage at the base 103 of the transistor 101 to provide a positive voltage trigger at the base 103. This positive voltage can trigger avalanche in the transistor 101. In some embodiments, the inductor 132 pulse can be a very brief pulse of less than one nanosecond, in some embodiments less than 300 picoseconds (e.g. 80-120 picoseconds). In any case, the pulse can be less than an avalanche time of the transistor 101, where the avalanche time is defined as a time elapsed from the triggering of the avalanche to its completion. This can be a sufficiently brief pulse such that positive voltage is no longer present at the base 103 when the avalanche completes, or the positive voltage can be removed from the base 103 concurrently with avalanche completion or shortly thereafter.

Figure 4:
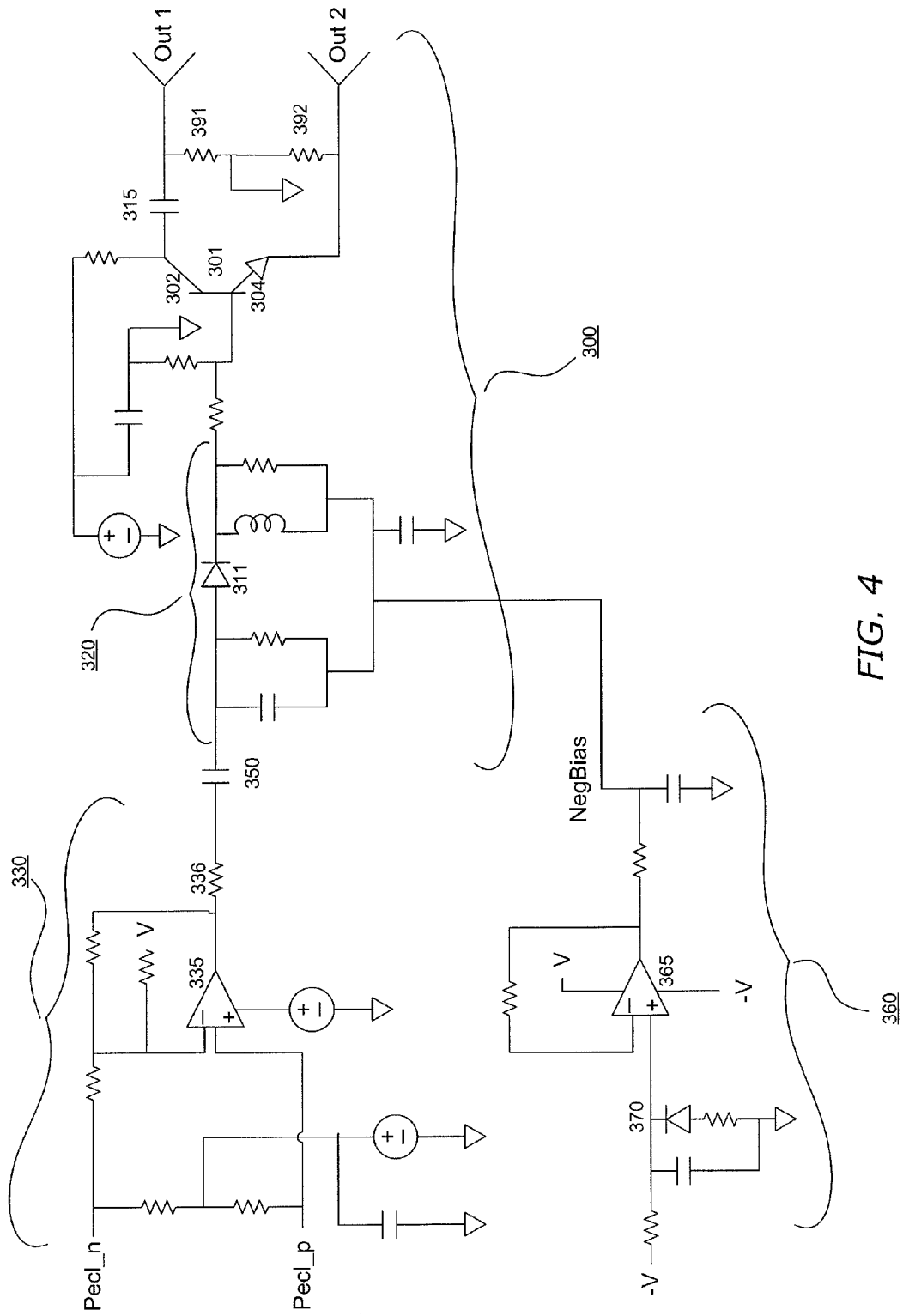
FIG. 4 depicts a circuit for generating a pulse according to a further embodiment consistent with the disclosure.

FIG. 4 depicts an avalanche pulser circuit 300 according to a further embodiment of the invention. The avalanche pulser circuit 300 of FIG. 4 is similar to the avalanche pulser circuit 100 of FIG. 2, but the output of the transistor 301 can be taken in differential output mode at the collector 302 and emitter 304 in the avalanche pulser circuit 300. In this embodiment, 50 ohm output resistors 391 and 392 are added in series with the collector capacitor 315 and at the emitter 304. In some examples of this avalanche pulser circuit 300, a differential output such as a 270 ohm differential, which can be chosen to match the impedance of an antenna, can be taken at the collector 302 and emitter 304. In this example, 270 ohm output resistors can be used in place of the 50 ohm output resistors 391 and 392. The operation of the avalanche pulser circuit 300 can be the same as the operation of the avalanche pulser circuit 100 of FIG. 2, but with a differential output. Further, the overall circuit depicted in FIG. 4 includes example trigger input generator 330 and negative bias generator 360 components.

The example trigger input generator 330 of FIG. 4 can include an amplifier 335. The amplifier 335 can shape the trigger pulse. The amplifier 335 can be an opamp or other amplifying circuit. An input signal can be supplied to the amplifier 335. For example, the input signal can be a positive emitter coupled logic (PECL) level input signal with pulse repetition frequency of 16 MHz or less and a 50% duty cycle, though other signals and different frequencies can be used. The amplifier 335 can amplify and/or condition the input signal. For example, the amplifier 335 can output a 6 or 8 Vpp amplified square wave, though other outputs can be possible. A resistor or resistors 336 can limit the current out of the amplifier 335. The trigger input generator 330 can be AC coupled to the rest of the circuit 300 with an AC coupling capacitor 350. In other embodiments, DC coupling can be used by omitting the capacitor 350 and setting the amplifier's 335 rails and summing a DC offset in order to drive the SRD 311.

The example negative bias generator 360 of FIG. 4 can include an amplifier 365. The amplifier 365 can receive a constant negative voltage or other signal and output a negative bias suitable for operation of the avalanche pulser circuit 300 as described above. For example, if the amplifier 335 is AC coupled and outputs a 6 Vpp signal, the negative bias generator 360 can output a −1 V signal so the input to the anode of the SRD 311 can be at or near zero volts when the amplifier 335 output is at or near its maximum voltage. This can prevent the transistor 301 from triggering on, as the cathode of the SRD 311 can be at a negative voltage below the voltage at the emitter 304 of the transistor 301. The negative bias generator 360 can employ an identical or substantially identical SRD 370 to the SRD 311 of the pulse trigger section 320 so that temperature compensation can be achieved. The example trigger input generator 330 and/or the example negative bias generator 360 of FIG. 4 can also be used with the avalanche pulser circuit 100 of FIG. 2.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above-described embodiments. For example, it is well known to those of ordinary skill in the relevant art(s) that circuits such as those presented above can have many equivalents which produce identical outputs when presented with the same inputs. Therefore, it should be understood that the scope of this document includes any circuit which can trigger avalanche in a transistor and bias the transistor off in order to produce a rapid pulse with a steep rising and falling edge.

In addition, it should be understood that any figures which highlight the functionality and advantages are presented for example purposes only. The disclosed methodology and system are each sufficiently flexible and configurable such that they can be utilized in ways other than those shown.

The invention claimed is:

1. A circuit for generating a pulse comprising:
   a transistor constructed and arranged to be operable in an avalanche mode;
   a pulse generating circuit constructed and arranged to receive at least one trigger input signal, generate a voltage pulse having a duration less than an avalanche time of the transistor in response to at least a portion of the at least one trigger input signal, and transmit the voltage pulse to a terminal of the transistor; and
   at least one negative bias generator constructed and arranged to generate a negative voltage;
   wherein the pulse generating circuit comprises:
      at least one step recovery diode (SRD) referenced to the negative voltage at a cathode of the at least one SRD, wherein the SRD is constructed and arranged to receive the at least one trigger input signal at an anode of the at least one SRD, store charge when the at least one trigger input signal has a positive voltage, and stop storing charge when the at least one trigger input signal has a negative voltage; and
      at least one inductor constructed and arranged to generate the voltage pulse after the at least one SRD stops storing charge; and
   wherein the transistor is constructed and arranged to output an avalanche pulse from at least one terminal of the transistor in response to the voltage pulse.

2. The circuit of claim 1, wherein the transistor is constructed and arranged to be in an off condition at all times, except at a time when the voltage pulse is being transmitted to the terminal of the transistor.

3. The circuit of claim 2, wherein the negative voltage causes a voltage at a base terminal of the transistor to be more negative than a voltage at an emitter terminal of the transistor at all times except the time when the voltage pulse is being transmitted to the terminal of the transmitter.

4. The circuit of claim 1, wherein the at least one negative bias generator comprises a negative bias amplifier constructed and arranged to receive at least one negative bias input signal and amplify the at least one negative bias input signal to generate the at least one negative voltage.

5. The circuit of claim 4, wherein the at least one negative bias generator further comprises at least one temperature compensating SRD that is substantially identical to the at least one SRD.

6. The circuit of claim 1, wherein the pulse generating circuit further comprises at least one resistor constructed and arranged to damp the voltage pulse.

7. The circuit of claim 1, wherein the transistor is an NPN transistor.

8. The circuit of claim 1, wherein the avalanche pulse has a duration of about 250 to 350 picoseconds.

9. The circuit of claim 1, wherein the voltage pulse has a duration less than about 300 picoseconds.

10. The circuit of claim 1, wherein the avalanche pulse is output at an emitter terminal of the transistor.

11. The circuit of claim 1, wherein the avalanche pulse is differentially output at a collector terminal and an emitter terminal of the transistor.

12. The circuit of claim 1, further comprising at least one voltage source constructed and arranged to transmit at least one signal to a collector terminal of the transistor.

13. The circuit of claim 1, wherein the at least one trigger input signal comprises a square wave with a 50% duty cycle.

14. The circuit of claim 1, further comprising a trigger input amplifier constructed and arranged to receive at least one input signal and amplify the at least one input signal to generate the at least one trigger input signal.

15. The circuit of claim 14, further comprising at least one coupling capacitor constructed and arranged to couple the trigger input amplifier to the pulse generating circuit.

16. A method for generating a pulse comprising:
receiving at least one trigger input signal with a pulse generating circuit;
generating a voltage pulse in response to at least a portion of the at least one trigger input signal with the pulse generating circuit;
transmitting the voltage pulse from the pulse generating circuit to a terminal of a transistor constructed and arranged to be operable in an avalanche mode;
outputting an avalanche pulse from at least one terminal of the transistor in response to the voltage pulse; and
generating a negative voltage with at least one negative bias generator;
wherein generating the voltage pulse comprises:
receiving the at least one trigger input signal at an anode of at least one step recovery diode (SRD) referenced to the negative voltage at a cathode of the at least one SRD;
storing charge with the SRD when the at least one trigger input signal has a positive voltage, and stopping storing charge with the SRD when the at least one trigger input signal has a negative voltage; and
generating the voltage pulse with at least one inductor after the at least one SRD stops storing charge; and
wherein the voltage pulse has a duration less than an avalanche time of the transistor.

17. The method of claim 16, further comprising keeping the transistor in an off condition at all times except a time when the voltage pulse is being transmitted to the terminal of the transistor.

18. The method of claim 17, wherein the negative voltage causes a voltage at a base terminal of the transistor to be more negative than a voltage at an emitter terminal of the transistor at all times except the time when the voltage pulse is being transmitted to the terminal of the transmitter.

19. The method of claim 16, wherein generating the negative voltage comprises:
receiving at least one negative bias input signal with a negative bias amplifier; and
amplifying the at least one negative bias input signal with the negative bias amplifier to generate the at least one negative voltage.

20. The method of claim 19, further comprising compensating a temperature with at least one temperature compensating SRD that is substantially identical to the at least one SRD.

21. The method of claim 16, wherein generating the voltage pulse further comprises damping the voltage pulse with at least one resistor.

22. The method of claim 16, wherein the transistor is an NPN transistor.

23. The method of claim 16, wherein the avalanche pulse has a duration of about 250 to 350 picoseconds.

24. The method of claim 16, wherein the voltage pulse has a duration of less than about 300 picoseconds.

25. The method of claim 16, wherein the avalanche pulse is output at an emitter terminal of the transistor.

26. The method of claim 16, wherein the avalanche pulse is differentially output at a collector terminal and an emitter terminal of the transistor.

27. The method of claim 16, further comprising transmitting at least one signal to a collector terminal of the transistor with a voltage source.

28. The method of claim 16, wherein the at least one trigger input signal comprises a square wave with a 50% duty cycle.

29. The method of claim 16, further comprising:
receiving at least one input signal with a trigger input amplifier and;
amplifying the at least one input signal with the trigger input amplifier to generate the at least one trigger input signal.

30. The method of claim 29, wherein the trigger input amplifier is coupled to the pulse generating circuit with at least one coupling capacitor.

31. A radar system comprising:
an avalanche pulser circuit, the avalanche pulser circuit comprising:
a transistor constructed and arranged to be operable in an avalanche mode;
a pulse generating circuit constructed and arranged to receive at least one trigger input signal, generate a voltage pulse having a duration less than an avalanche time of the transistor in response to at least a portion of the at least one trigger input signal, and transmit the voltage pulse to a terminal of the transistor, wherein the transistor is constructed and arranged to output an avalanche pulse from at least one terminal of the transistor in response to the voltage pulse;
an antenna connected to the avalanche pulser circuit, the antenna constructed and arranged to transmit the avalanche pulse and receive a return pulse;
a processor connected to the antenna, the processor constructed and arranged to process the return pulse, generate image data, and transmit the image data to a display; and
at least one negative bias generator constructed and arranged to generate a negative voltage;
wherein the pulse generating circuit comprises:
at least one step recovery diode (SRD) referenced to the negative voltage at a cathode of the at least one SRD, wherein the SRD is constructed and arranged to receive the at least one trigger input signal at an anode of the at least one SRD, store charge when the at least one trigger input signal has a positive voltage, and stop storing charge when the at least one trigger input signal has a negative voltage; and
at least one inductor constructed and arranged to generate the voltage pulse after the at least one SRD stops storing charge.

32. The radar system of claim 31, wherein the transistor is constructed and arranged to be in an off condition at all times except a time when the voltage pulse is being transmitted to the terminal of the transistor.

33. The radar system of claim 32, wherein the negative voltage causes a voltage at a base terminal of the transistor to be more negative than a voltage at an emitter terminal of the transistor at all times except the time when the voltage pulse is being transmitted to the terminal of the transmitter.

34. The radar system of claim 31, wherein the at least one negative bias generator comprises a negative bias amplifier constructed and arranged to receive at least one negative bias input signal and amplify the at least one negative bias input signal to generate the at least one negative voltage.

35. The radar system of claim 34, wherein the at least one negative bias generator further comprises at least one temperature compensating SRD that is substantially identical to the at least one SRD.

36. The radar system of claim 31, wherein the pulse generating circuit further comprises at least one resistor constructed and arranged to damp the voltage pulse.

37. The radar system of claim 31, wherein the transistor is an NPN transistor.

38. The radar system of claim 31, wherein the avalanche pulse has a duration of about 250 to 350 picoseconds.

39. The radar system of claim 31, wherein the voltage pulse has a duration less than about 300 picoseconds.

40. The radar system of claim 31, wherein:
the avalanche pulse is output at an emitter terminal of the transistor; and
the antenna is connected to the emitter terminal of the transistor.

41. The radar system of claim 31, wherein:
the avalanche pulse is differentially output at a collector terminal and an emitter terminal of the transistor; and
the antenna is connected to the collector terminal and the emitter terminal of the transistor.

42. The radar system of claim 31, further comprising at least one voltage source constructed and arranged to transmit at least one signal to a collector terminal of the transistor.

43. The radar system of claim 31, wherein the at least one trigger input signal comprises a square wave with a 50% duty cycle.

44. The radar system of claim 31, further comprising a trigger input amplifier constructed and arranged to receive at least one input signal and amplify the at least one input signal to generate the at least one trigger input signal.

45. The radar system of claim 44, further comprising at least one coupling capacitor constructed and arranged to couple the trigger input amplifier to the pulse generating circuit.

46. The radar system of claim 31, further comprising a controller constructed and arranged to control the at least one trigger input signal.

47. A method for creating a radar image comprising:
receiving at least one trigger input signal with a pulse generating circuit;
generating a voltage pulse in response to at least a portion of the at least one trigger input signal with the pulse generating circuit;
transmitting the voltage pulse from the pulse generating circuit to a terminal of a transistor constructed and arranged to be operable in an avalanche mode;
outputting an avalanche pulse from at least one terminal of the transistor to an antenna in response to the voltage pulse;
transmitting the avalanche pulse with the antenna;
receiving a return pulse with the antenna;
processing the return pulse with a processor to generate image data;
transmitting the image data to a display; and
generating a negative voltage with at least one negative bias generator;
wherein generating the voltage pulse comprises:
receiving the at least one trigger input signal at an anode of at least one step recovery diode (SRD) referenced to the negative voltage at a cathode of the at least one SRD;
storing charge with the SRD when the at least one trigger input signal has a positive voltage, and stopping storing charge with the SRD when the at least one trigger input signal has a negative voltage; and
generating the voltage pulse with at least one inductor after the at least one SRD stops storing charge; and
wherein the voltage pulse has a duration less than an avalanche time of the transistor.

48. The method of claim 47, further comprising keeping the transistor in an off condition at all times except a time when the voltage pulse is being transmitted to the terminal of the transistor.

49. The method of claim 48, wherein the negative voltage causes a voltage at a base terminal of the transistor to be more negative than a voltage at an emitter terminal of the transistor at all times except the time when the voltage pulse is being transmitted to the terminal of the transmitter.

50. The method of claim 47, wherein generating the negative voltage comprises:
receiving at least one negative bias input signal with a negative bias amplifier; and
amplifying the at least one negative bias input signal with the negative bias amplifier to generate the at least one negative voltage.

51. The method of claim 50, further comprising compensating a temperature with at least one temperature compensating SRD that is substantially identical to the at least one SRD.

52. The method of claim 47, wherein generating the voltage pulse further comprises damping the voltage pulse with at least one resistor.

53. The method of claim 47, wherein the transistor is an NPN transistor.

54. The method of claim 47, wherein the avalanche pulse has a duration of about 250 to 350 picoseconds.

55. The method of claim 47, wherein the voltage pulse has a duration of less than about 300 picoseconds.

56. The method of claim 47, wherein:
the avalanche pulse is output at an emitter terminal of the transistor; and
the antenna is connected to the emitter terminal of the transistor.

57. The method of claim 47, wherein:
the avalanche pulse is differentially output at a collector terminal and an emitter terminal of the transistor; and
the antenna is connected to the collector terminal and the emitter terminal of the transistor.

58. The method of claim 47, further comprising transmitting at least one signal to a collector terminal of the transistor with a voltage source.

59. The method of claim 47, wherein the at least one trigger input signal comprises a square wave with a 50% duty cycle.

60. The method of claim 47, further comprising:
receiving at least one input signal with a trigger input amplifier and;

amplifying the at least one input signal with the trigger input amplifier to generate the at least one trigger input signal.

61. The method of claim 60, wherein the trigger input amplifier is coupled to the pulse generating circuit with at least one coupling capacitor.

62. The method of claim 47, further comprising controlling the at least one trigger input signal with a controller.

* * * * *